US007902933B1

(12) United States Patent
Brennan

(10) Patent No.: US 7,902,933 B1
(45) Date of Patent: Mar. 8, 2011

(54) OSCILLATOR CIRCUIT

(75) Inventor: Aaron Brennan, Moscow, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 181 days.

(21) Appl. No.: 11/692,887

(22) Filed: Mar. 28, 2007

Related U.S. Application Data

(60) Provisional application No. 60/786,908, filed on Mar. 29, 2006.

(51) Int. Cl.
H03B 5/32 (2006.01)
(52) U.S. Cl. .................. 331/158; 331/16; 331/36 C; 331/116 R; 331/175; 331/179; 331/182; 331/183
(58) Field of Classification Search .......... 331/116 R, 331/158, 175, 176, 179, 177 R, 182, 116 FE, 331/36 C, 17, 16, 177 V, 183, 117 R
See application file for complete search history.

(56) References Cited

U.S. PATENT DOCUMENTS

| 4,013,979 | A | | 3/1977 | Vittoz |
| 4,788,466 | A | | 11/1988 | Paul et al. |
| 5,117,206 | A | * | 5/1992 | Imamura ............... 331/158 |
| 5,511,126 | A | * | 4/1996 | Westwick .............. 331/44 |
| 5,534,826 | A | | 7/1996 | Logan |
| 5,621,396 | A | | 4/1997 | Flaxl |
| 5,657,243 | A | | 8/1997 | Toyonaga et al. |
| 5,774,006 | A | | 6/1998 | Barel et al. |
| 5,844,448 | A | * | 12/1998 | Jackoski et al. ......... 331/158 |
| 5,999,062 | A | | 12/1999 | Gilbert |
| 6,094,105 | A | * | 7/2000 | Williamson .......... 331/116 FE |
| 6,181,211 | B1 | | 1/2001 | Aho et al. |
| 6,236,843 | B1 | * | 5/2001 | Goto ..................... 455/260 |
| 6,281,761 | B1 | * | 8/2001 | Shin et al. ............. 331/116 FE |
| 6,476,682 | B1 | * | 11/2002 | Cole et al. ............ 331/176 |
| 6,696,898 | B1 | | 2/2004 | Ward et al. |
| 6,710,669 | B2 | | 3/2004 | Hasegawa et al. |
| 6,747,522 | B2 | * | 6/2004 | Pietruszynski et al. ... 331/177 R |
| 6,759,914 | B2 | | 7/2004 | Rusznyak |
| 6,798,301 | B1 | | 9/2004 | Balan et al. |
| 6,954,113 | B2 | * | 10/2005 | Fallisgaard et al. ....... 331/158 |
| 6,959,217 | B2 | * | 10/2005 | DelMain et al. ........... 607/60 |
| 7,009,460 | B2 | | 3/2006 | Wilcox |
| 7,123,113 | B1 | * | 10/2006 | Brennan et al. .......... 331/158 |
| 7,348,861 | B1 | * | 3/2008 | Wu et al. ............... 331/158 |
| 7,421,052 | B2 | * | 9/2008 | Li ......................... 375/374 |
| 2005/0231240 | A1 | * | 10/2005 | Goldfarb et al. ........ 327/105 |
| 2006/0068736 | A1 | * | 3/2006 | Kerth et al. ............ 455/255 |
| 2007/0018740 | A1 | * | 1/2007 | Gabara .................. 331/167 |
| 2007/0030085 | A1 | | 2/2007 | Brennan et al. |

FOREIGN PATENT DOCUMENTS

EP   0709965 A1   5/1996

OTHER PUBLICATIONS

USPTO Non-Final Rejection for U.S. Appl. No. 11/277,185 dated Oct. 19, 2009; 11 pages.

(Continued)

Primary Examiner — Arnold Kinkead
Assistant Examiner — Richard Tan

(57) ABSTRACT

Described is a circuit comprising an oscillator, an amplifier unit and a control unit. The amplifier unit is coupled to the oscillator and to the control unit; and the control unit is arranged to regulate a load capacitance to the oscillator at startup.

4 Claims, 5 Drawing Sheets

OTHER PUBLICATIONS

USPTO Advisory Action for U.S. Appl. No. 11/277,185 dated Jul. 29, 2009; 3 pages.

USPTO Final Rejection for U.S. Appl. No. 11/277.165 dated May 14, 2009; 10 pages.

USPTO Non-Final Rejection for U.S. Appl. No. 11/277, 65 dated Dec. 15, 2008; 10 pages.

USPTO Final Refection for U.S. Appl. No. 11/277,185 dated Jul. 1, 2008; 11 pages.

USPTO Non-Final Rejection for U.S. Appl. No. 11/277,185 dated Dec. 26, 2007; pages.

The Written Opinion of the International Searching Authority for International Application No. PCT/US2006/010533 mailed Jul. 7, 2006; 7 pages.

International Search Report of the International Searching Authority for International Application No. PCT/US2006/010533 mailed Jul. 7, 2006: 4 pages.

Chow et al,, "High Performance Automatic Gain Control Circuit Using a S/H Peak-Detector for ASK Receiver," 9th International Conference on Electronics, Circuits and Systems, Sep. 2002, vol. 2, pp. 429-432; 4 pages.

Koli et al., "Low Voltage MOS-Transistor-Only Precision Current Peak Detector with Signal Independent Discharge Time Constant," 1997 IEEE International Symposium on Circuit and Systems, Jun. 1997, vol. 3, pp. 1992-1995; 4 pages.

USPTO Notice of Allowance for U.S. Appl. No. 10/866,510 dated Jun. 16, 2006; 7 pages.

USPTO Non-Final Rejection for U.S. Appl. No. 10/866,510 dated Feb. 16, 2006; 10 pages.

USPTO Non-Final Rejection for U.S. Appl. No. 10/866,510 dated Sep. 26, 2005; 9 pages.

Bianchi et al., "Analog ALC Crystal Oscillators for High-Temperature Applications," IEEE Transactions on Solid-State Circuits, vol. 35, No. 1, Jan. 2000, pp. 2-14; 13 pages.

Vittoz, "Low-POwer High-Precision Crystal Oscillators," PLL's, Oscillators and Frequency Synthesizers MEAD Course, Apr. 1998; 38 pages.

Vittoz et al., "High-Performance Crystal Oscillator Circuits: Theory and Application," IEEE Journal of Solid-State Circuits, vol. 23, No. 3, Jun. 1988, pp. 774-783 10 pages.

Margarit et al., "A Low-Noise, Low Power VCO with Automatic Amplitude Control for Wireless Applications," IEEE Journal of Solid-State Circuits, vol. 34, No. 6, Jun. 1999, pp. 761-771; 11 pages.

USPTO Final Rejection for U.S. Appl. No. 11/277,185 dated Feb. 22, 2010; 12 pages.

USPTO Notice of Allowance for U.S. Appl. No. 11/277,185 dated Apr. 30, 2010; 6 pages.

* cited by examiner

201

OSCILLATOR CIRCUIT

CROSS-REFERENCE TO RELATED APPLICATIONS

The present application claims the benefit of priority under 35 U.S.C. 119(e) to U.S. Provisional Patent Application Ser. No. 60/786,908, entitled Oscillator Circuit; which application is hereby incorporated by reference.

TECHNICAL FIELD

This invention relates to an electronic circuit and in particular to an oscillator circuit with a startup capacitor override circuit.

BACKGROUND

Crystal oscillators are found in many electrical circuits, and are devices that are fabricated to resonate at predefined frequencies in response to applied voltages. For example, a color burst crystal resonates at a frequency of 3.57954 megahertz (MHz) and may be found in many televisions and radios. Many systems and circuits utilize crystal oscillators to provide a clock reference representative of relative time that is the crystal oscillators provide an oscillation source to a clock generator circuit. A clock generator takes an oscillation source input and generates a digital clock for use in electronic circuits. For example, microprocessors and microcontrollers typically utilize crystal oscillators to derive system clocks that control the rate at which data is read by input/output ports and/or the rate at which programming instructions are executed. Communication systems and components such as telecommunications infrastructure and mobile units use crystal oscillators to generate one or more frequencies that are useful in producing radio frequency (RF) signals onto which information to be broadcast and received is imparted. Crystal oscillators also have tolerance ranges associated with their resonant frequency, and a frequency offset in a crystal oscillator. For example, a crystal oscillator is usually used to generate a master reference clock that is used to synchronize information exchange between telecommunications infrastructure and mobile units.

To control more precisely the resonant frequency of a crystal oscillator, conventional communication systems utilize a digitally controlled crystal oscillator (DCXO) system in conjunction with a crystal. A DCXO system typically includes a processing portion that monitors the resonant frequency produced by a crystal oscillator and alters the resonant frequency of the crystal oscillator by outputting a code to a DCXO circuit that changes the capacitive loading on the crystal oscillator to tune the frequency of the crystal oscillator.

In practice, when a DCXO system is first powered up, for example when a mobile telephone is switched on, an initial DCXO code is used to set the loading capacitance of the crystal oscillator. The initial frequency output by the crystal needs only to be within a few parts-per million (PPM) of the target frequency. After communication is established with another entity, fine frequency tuning may be carried out during which the DCXO changes its output code to refine the load capacitance and bring the resonant frequency within fractions of a PPM of the target frequency i.e., to lower the offset.

Based on various environmental characteristics, such as process, voltage, and temperature (PVT) variations, the resonant frequency of a crystal oscillator may not meet the initial frequency accuracy of a few PPM under all conditions that is an initial offset of the frequency system may be larger than desired. Therefore, many manufacturers calibrate a DCXO with an initial code for operation with a particular crystal oscillator at one specific temperature and store the DCXO code associated with that crystal in memory, such as flash memory, before shipping the product. In the field, when the device attempts to establish initial communication, the DCXO code stored in memory is applied as a first attempt to load the crystal oscillator to achieve the desired oscillator frequency.

However, even when the pre-calibrated DCXO code is loaded, there is no guarantee that the ambient temperature of the crystal oscillator is the same as the calibration temperature at which the initial DCXO code was selected. Additionally, there is no guarantee that the temperature coefficient of the crystal, the supply voltage, and the DCXO circuit will not shift the frequency offset produced using the DCXO code to an unacceptable level. Further, as crystals age, their resonant frequencies may change, thereby potentially rendering the initial DCXO code ineffective. A further disadvantage related to startup of oscillators is the amount of negative resistance applied to the oscillator before oscillations begin. Effects of drive level dependency (DLD) in crystals produces startup problems in oscillators because of the motional resistance of the DLD for crystals at very low drive levels increases rapidly and often abruptly. Yet a further disadvantage is that changes in resistance at lower drive levels and changes in frequency at higher drive levels become noticeable. The high resistance at low drive levels causes startup problems because it is at this point that the oscillator starts from the inherent noise contained in the oscillator's bandwidth and the power levels are orders of magnitude lower than at normal large signal operation. Further, properties like surface micro-cracks and particle contamination also causes this phenomenon.

It would therefore be desirable to have an improved oscillator circuit, the oscillator capable of initiating oscillations with minimum load during startup.

BRIEF DESCRIPTION OF THE DRAWINGS

Aspects of the present inventions are described with reference to the accompanying drawings. The drawings illustrating the embodiments of the invention and together with the description, serve to explain the principles of the invention. In the drawings.

DETAILED DESCRIPTION

Figure 1:
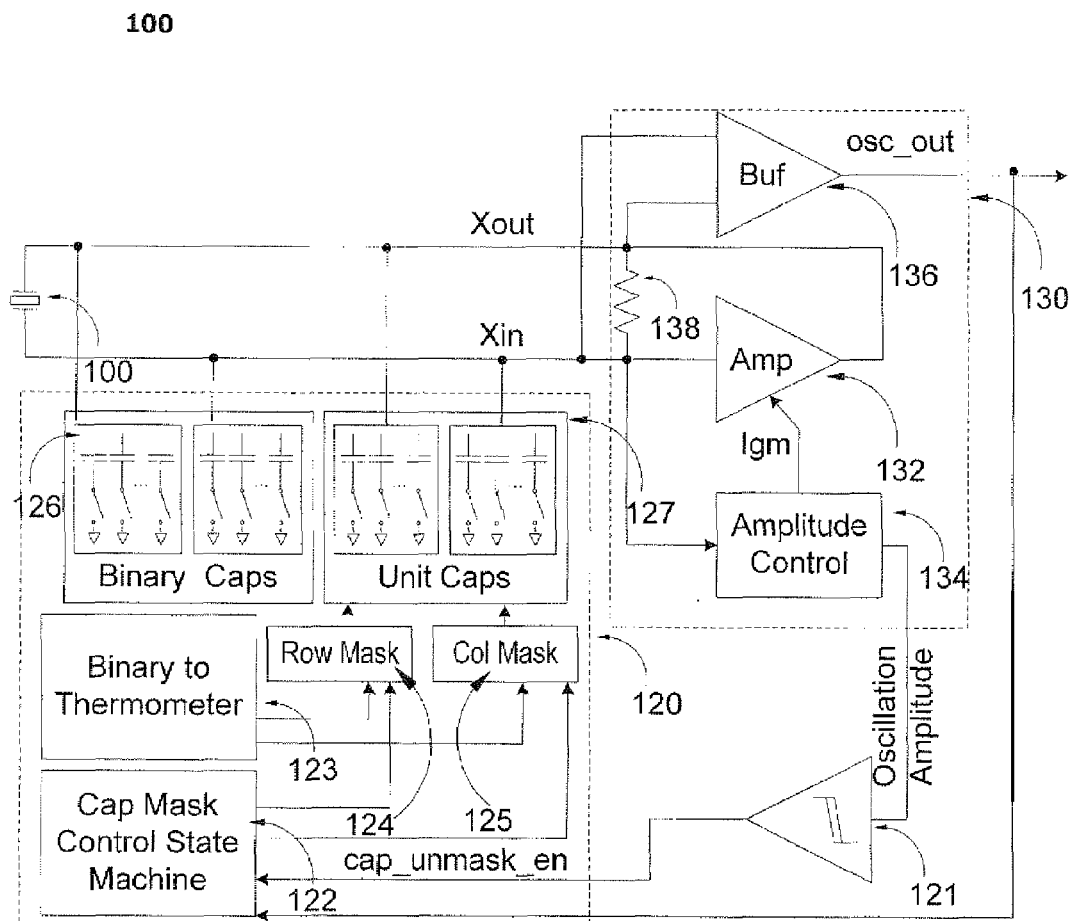
FIG. 1 illustrates an oscillator circuit with startup override.

According to a first embodiment, the present invention comprises an oscillator circuit 100, for example a digitally controlled oscillator circuit (DCXO), wherein the oscillator circuit 100 includes a startup capacitor override circuit. The oscillator circuit 100 comprises a resonator 110, a control unit 120 and an amplifier unit 130 as illustrated in FIG. 1. The amplifier unit 130 is coupled to the resonator 110 and to the control unit 120. The control unit is configured to regulate or control a load capacitance 127 for achieving steady state oscillations. For example, the control unit 120 is configured such that the load capacitance 127 at startup of the resonator 110 is at a minimum possible value. By minimizing the load capacitance 127 at startup, the negative resistance applied to the resonator 110 by amplifier unit 130 will peak to a maximum possible value, which is advantageously used for initiating steady state oscillations from the oscillator circuit 100.

Oscillator circuits 100 having a large negative resistance at startup are advantageously used in programmable clock chips, microprocessor chips, micro-controller chips and the likes, wherein said chips typically comprises a digitally controlled oscillator circuit that utilizes a digitally controlled load capacitors. For the oscillator circuit 100, as a greater negative resistance is provided to the circuit 100 then the startup of the circuit 100 will be faster and more robust. During startup of the oscillator in the circuit 100 the amount of negative resistance applied to the oscillator before steady state oscillations is a factor for consideration for the operation of the oscillator. The oscillator comprises the resonator 110 and the amplifier 132.

The negative resistance applied to a given oscillator is typically a function of the amplifier gain 'Igm' and load capacitance 127 of the circuit 100. If the circuit 100 is not designed to provide a sufficiently large negative resistance during startup, the oscillator will not be able to provide an output clock pulse 'ocs_out' as shown in FIG. 1. The circuit 100 is designed such that the negative resistance for the oscillator at startup is a maximum possible value, wherein the oscillator comprises the resonator 110 and the amplifier 132, thereby ensuring that the oscillator, and hence the circuit 100 provides an output clock pulse 'ocs_out'. Advantageously, by providing the maximum possible negative resistance to the oscillator at startup, initial power consumption of the circuit 100 is reduced.

In a further embodiment, the amplifier unit 130 of the circuit 100 comprises an amplifier 132 and amplitude controller 134 and a buffer amplifier 136. The amplifier 132 is coupled to the amplitude controller 134 and the buffer amplifier 136. The amplifier 132 is also coupled to the resonator 110 such that the amplifier 132 receives an input oscillatory signal 'Xin', hereinafter also referred to also as 'Xin' signal, from the resonator 110. The amplifier unit 130 of the circuit 100 constitutes the amplifier 132, the amplitude controller 134 and the buffer amplifier 136. The components of the amplifier unit 130 are coupled to the resonator 110.

Conventionally the resonator 110 and the amplifier 132 constitutes an oscillator, which provides a clock signal, also referred to as clock pulse, as an output 'osc_out'. This clock pulse can be then supplied to various other devices as an input, for example the clock pulse 'ocs_out' can be supplied to programmable dividers, microprocessors chips, microcontrollers chips and the likes as an input signal. The resonator 110 and amplifier 132 generate a differential sinusoidal signal between the 'Xin' signal and a 'Xout' signal, which in turn is converted by the buffer amplifier 136 into a digital signal 'ocs_out' for example a clock pulse or clock signal.

In a further embodiment, the resonator 110 is arranged to generate a 'Xin' signal as illustrated schematically in FIG. 1. The sinusoidal oscillator signal, i.e., the 'Xin' signal, is created typically because of a high Q factor of the resonator 110, and is provided as an input signal to the amplifier unit 130, wherein the amplifier 132 is configured to compensate the losses incurred in the 'Xin' signal due to resistances in the resonator 110. An output oscillatory signal, also referred to as 'Xout' signal, is generated from the amplifier 132, which is a compensated signal, wherein the losses incurred due to the resonator 110 are compensated, such that the resonator 110 achieves steady state oscillations. The 'Xin' signal is also simultaneously provided to the amplitude controller 134 and the buffer amplifier 136. The resonator 110 is in the feedback loop of the amplifier 132. As discussed earlier, the buffer amplifier 136 converts the input oscillatory signal, for example a sinusoidal wave, into a digital wave, for example a clock pulse or square wave.

In a further embodiment, the amplitude controller 134 detects or determines amplitude of oscillation and uses the detected amplitude data to control the gain of the amplifier 130 such that the amplifier 130 exactly compensates for the losses encountered in resonator 110 and results in steady state oscillations. In yet a further embodiment, the amplitude controller 134 provides a gain control signal, illustrated as 'Igm' in FIG. 1, wherein the gain control signal is provided to the amplifier 132 from the amplitude controller 134. This gain control signal provided from the amplitude controller 134 to the amplifier 132 is critical in regulating the amplitude of the 'Xout' signal from the amplifier.

In a further embodiment, the resonator 110 and the amplifier 132 form the oscillator. The amplitude controller 134 can determine whether the 'oscillation amplitude' is greater than or less than a predefined threshold. The detection of the 'oscillation amplitude' being defined to be above the predefined threshold or below the predefined threshold is a function of the oscillator circuit 100, especially during startup. When the 'oscillation amplitude' is detected to be lower than the predefined threshold, a control unit 120 sets the load capacitance 127 to a minimum possible capacitance value such that the load capacitance 127 at startup is at a minimum capacitance value. And when the 'oscillation amplitude' is detected to be greater than the predefined threshold, the control unit 120 sets the load capacitance 127 to a capacitance value required to achieve a desired frequency for steady-state oscillations.

In a further embodiment, the buffer amplifier 136 is arranged to convert the output differential oscillatory signal between the 'Xin' signal and the 'Xout' signal, for example a sinusoidal signal from the oscillator comprising the resonator 110 and the amplifier 132, into a digital signal, which for example is a square wave. The 'Xout' signal is provided as a feedback to the resonator 110. Simultaneously, the 'Xout' signal is also provided to the buffer amplifier 136, which converts the sinusoidal wave into a digital signal 'osc_out' when the oscillator has reached steady state oscillations. Such a digital signal, for example a clock pulse, is advantageously provided to digitally operated electronic circuits or devices for example divider, microprocessors, micro-controllers and the likes.

In a further embodiment, as illustrated in FIG. 1, the circuit 100 comprises a control unit 120. The control unit 120 further comprises a first array of capacitor 126 for example binary weighted capacitors, a second array of capacitors 127 for example unit capacitors, a decoder 123 for example a thermometer decoder and a binary decoder, a state machine 122 and a comparator 121 for example a buffer with hysteresis.

The comparator 121 for example can be a typical window comparator that uses two comparators and a single operational amplifier to determine if the 'oscillation amplitude' is inside or outside a predefined boundary region. The 'oscillation amplitude' signal is a quasi-DC signal that is proportional to an oscillation envelope. The amplitude controller 134 detects peaks in the sinusoidal 'Xin' signal. In a further embodiment the circuit is arranged to change the value of a hold_cap state, if the detected amplitude is larger than the voltage on the capacitor.

In a further embodiment, a leakage mechanism may be provided to the control unit 120 of the circuit 100, wherein the leakage mechanism slowly discharges the capacitors 126 and/or 127 in the control unit 120 to allow tracking of a decreasing 'oscillation amplitude'. Thus, the voltage on the each capacitor in the array of capacitors 126 and/or 127 is proportional to the 'oscillation amplitude' of the circuit 100.

In a further embodiment, the decoder 123 includes a binary decoder for controlling the first array of capacitors 126 in the control unit 120. In a further embodiment, the decoder 123 includes a thermometer decoder from controlling the second array of capacitors 127 in the control unit. The binary decoder and the thermometer decoder are responsible for controlling the first array of capacitors 126 and second array of capacitors 127 respectively.

In a further embodiment, the thermometer decoder is derived from the most significant bits (MSB) in a binary input which is used to select the desired load capacitance 127. The first array of capacitors 126 comprises a plurality of binary weighted capacitors, each of the binary weighted capacitors comprising a number of capacitors or capacitance lines. For example, the binary weighted capacitors comprise a first set of capacitors connected between the 'Xin' signal and a ground reference, for example a voltage reference, the ground reference hereinafter also referred to as ground. A second set of capacitors connected between the 'Xout' signal and the ground. A first control signal arising from the first array of capacitors 126, that is the binary weighted load capacitor control signal, is not affected by the state or transitions of the state machine 122 in the control unit 120.

In a further embodiment, the state machine 122 includes control logic to determine if a thermometer decoder capacitor 127 is in the ON state or the OFF state. Though the state machine 122 does not modify the binary weighted load capacitor control signals, which is the first control signal, a second set of control signals from the thermometer decoder load capacitor is arranged to pass through a mask. If the thermometer decoded control line is masked, the output mask corresponding to the control line will be in the OFF state. In a further embodiment, the addressing from the thermometer decoder can be split into row masks 124 and column masks 125. However, it should be apparent to a skilled person that there exist other methods of splitting the thermometer decoder which can be used within the scope of the invention, resulting in an efficient means to control the thermometer decoded capacitors in the circuit 100. The thermometer decoder is derived from the binary decoder as illustrated in Table 1.

TABLE 1

| Decimal | Binary Decoder | Thermometer Decoder |
|---------|----------------|---------------------|
| 0 | 000 | 0000000 |
| 1 | 001 | 0000001 |
| 2 | 010 | 0000011 |
| 3 | 011 | 0000111 |
| 4 | 100 | 0001111 |
| 5 | 101 | 0011111 |
| 6 | 110 | 0111111 |
| 7 | 111 | 1111111 |

The Table above shows a typical conversion of a decimal to binary decoder wherein the binary decoder being mapped to a thermometer decoder. For example, from Table 1 for a decimal value 0, the corresponding binary decoder value is 000 and the corresponding mapping thermometer decoder value is 0000000, and when the decimal value is 3, the corresponding binary decoder value is 011 and the corresponding mapping thermometer decoder value is 0000111, and when the decimal value is 7, the corresponding binary decoder value is 111 and the corresponding mapping thermometer decoder value is 1111111. The number of binary versus thermometer bits could change, for example all binary or all thermometer decoded bits. It should be apparent to a person skilled in the art that such decoding can be achieved using for example bubble suppression logic, thermometer decoder logic, synchronization or handshaking logic schemes and other available coding and/or decoding schemes available in the art. For example, in one such basic scheme the thermometer decoder generates a "1 of" code which is then converted to binary.

The thermometer decoder controls switching of the second array of capacitors 127 that are present in the control unit 120, which are preferably the unit capacitors and form the load capacitance for the oscillator. The thermometer decoder value is derived from the mapping of the corresponding binary decoder using Table 1 respectively. In a further embodiment, the total capacitance of the first array of capacitors 126 and the second array of capacitors 127 is sometime the effective capacitance or the load capacitance of the oscillator circuit 100. The switching of the first array of capacitors 126 and the second array of capacitors 127 will determine the effective load capacitance of the oscillator circuit 100.

In a further embodiment, the state machine 122 determines an instant at which a particular thermometer decoded capacitor is turned ON or OFF. A clock signal output 'osc_out' from the buffer amplifier 136 is provided to the state machine 122 and the output signal from the comparator of the 'oscillation amplitude' is also provided to the state machine 122. The state machine determines from the clock signal output 'osc_out' and from the 'oscillation amplitude' whether the 'oscillation amplitude' is either above or below the predefined threshold, and then determines which of the thermometers decoder capacitors are turned ON or OFF. Preferably, the thermometer decoder capacitors are arranged within the row mask 124 and the column mask 125.

The state machine 122 is arranged to regulate the load capacitance, particularly the second array of capacitors 127, to a minimum value at startup such that the oscillator circuit 100 has a minimum capacitance at relatively smaller amplitudes, and to a desired capacitance value when the oscillator produces steady state oscillations. The capacitance provided by first array of capacitors 126 is significantly smaller than the capacitance provided by second array of capacitors 127. Thus the capacitance will be close to its minimum value if second array of capacitors 127 are set to their minimum value even if capacitors 126 are set at maximum possible value.

The state machine 122 sets the second array of capacitors 127 that is the load capacitance to a minimum possible capacitance value by overriding or masking the capacitance of the second array of capacitors 127 of the oscillator circuit 100 at startup. Minimizing the load capacitance of oscillator circuit 100 results in a maximum startup negative resistance. The thermometer decoder capacitors are unmasked one capacitor at a time that is one capacitor from the second array of capacitors 127 is unmasked at a given instant of time, which happens immediately after a state machine controlled delay, if the 'oscillation amplitude' provided to the comparator 121 is above a certain predefined capacitor override threshold. The unmasking of the capacitors from the second array of capacitors 127 will be disabled once the 'oscillation amplitude' detected is below the predefined capacitor override threshold.

Figure 2:
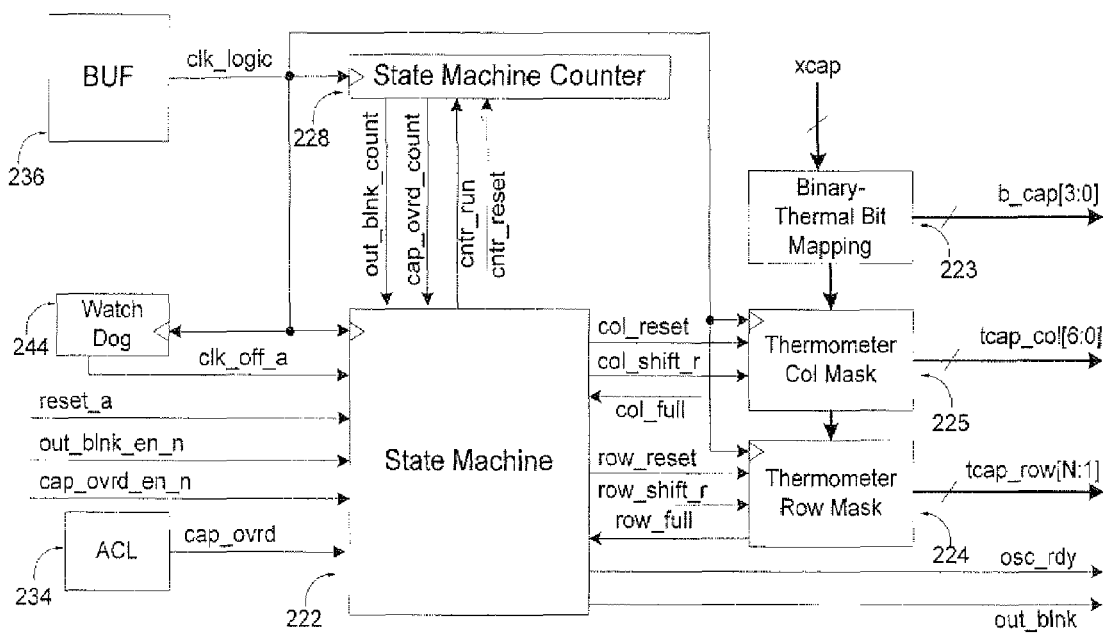
FIG. 2 illustrates capacitor override control logic.

FIG. 2 illustrates a schematic representation of a state machine controller 201, and in particular illustrates a representation of state machine 222 including output blanking and capacitor override control logic. It should be apparent to a person skilled in the art that other techniques may be used to achieve the same results as discussed previously of masking and unmasking capacitors. In one embodiment, the state machine 222 as shown in FIG. 2 is coupled to the buffer amplifier 236, to the thermometer row masks 224 and column masks 225, to an amplitude controller 234, a watchdog circuit 244, an in addition to a state machine counter with logic 228. Functioning of the amplitude controller 234, the output buffer 236, the state machine 222, the thermometer row mask 224 and thermometer column mask 225 have been described earlier with respect to FIG. 1. The state machine 222 is additionally coupled to a state machine counter and logic controller 228 that monitors the state machine. The output buffer 236 provides a clock signal to the state machine counter with logic 228, to the state machine 222 and to the watchdog circuit 244. The function of the watchdog circuit 224 is to monitor the input clock signal clk_logic provided to the state machine counter with logic 228 and to the state machine. When the clk_logic signal is OFF, the watchdog circuit 244 provides a clk_off_a signal to the state machine 222 indicating to the state machine 222 that there is no input clock signal.

The state machine 222 is responsible for setting the load capacitance 127, not shown in FIG. 2, to a minimum possible capacitance value by overriding or masking the load capacitance 127 during startup of the oscillator 100. As discussed earlier with respect to FIG. 1, by setting the load capacitance to a minimum possible value the negative resistance at startup for the oscillator circuit 100 is at a maximum possible value. The thermometer decoded capacitors that is one capacitor from the second array of capacitors 127, are unmasked at a given time after encountering a controlled delay from the state machine 222. The unmasking of the thermometer decoder capacitors occurs only if the 'oscillation amplitude' output from the comparator, not shown in FIG. 2, is above a predefined capacitor override threshold value i.e., the cap_u-mask_en signal. The masking of the load capacitances 127 will be disabled only if the detected 'oscillation amplitude' is below the predefined capacitor override threshold.

The 'xcap' input to the binary to thermal decoder, not shown in FIG. 2, determines the desired or exact load capacitance that is required by the oscillator circuit to achieve steady state oscillations. For example, the xcap[3:0] bits are connected directly to b_cap[3:0] that is binary capacitor 3:0. The xcap[6:4] bits are converted to the thermometer column bits tcap_col[6:0]. The remaining 'xcap' bits are converted to row decoder bits. The thermometer row bits and thermometer column bits that are selected by the 'xcap' input can be overridden by the state machine 222 with the thermometer row mask 224 and thermometer column mask 225. The control logic 228 comprises a ripple counter resource that is used to provide delays between predefined or particular transitions of the state machine 222. Depending on the logic state and the 'oscillation amplitude' the state machine 222 controls the thermometer column mask and the thermometer row mask to achieve minimum load capacitance of the circuit.

Further, the logic block 228 also provides a counter based output blanking function. If output blanking is enabled, the clock provided at the oscillator output will be blanked until a sufficient number of transitions have been counted using a ripple counter.

Two different types of asynchronous resets are shown in FIG. 2, the reset_a signal and the clk_off_a signal provided by an oscillator clock watchdog circuit. The watchdog circuit 244 provides a reset signal if a continuous clock is not detected at osc_out.

The state machine runs off the oscillator output clock so that it will stay in the current state if the clk_logic clock signal does not transition. This requires the signal to enter the reset state to be asynchronous. If the watchdog circuit 244 is not used, only the reset_a signal will result in the state machine 222 entering the reset state. The cntr_reset, col_reset, and row_reset signals are asserted in the reset state.

An array of capacitors as shown in FIG. 1 has one binary weighted cell 126 and multiple thermometer cells 124 and 125 that are arranged in a matrix form that control the second array of capacitors 127. The four least significant bits of the 'x-cap' signal control the binary weighted capacitors 126 or first array of capacitors, and the remaining bits of the 'x-cap' signal control the thermometer weighted caps 127 or second array of capacitors.

Figure 3:
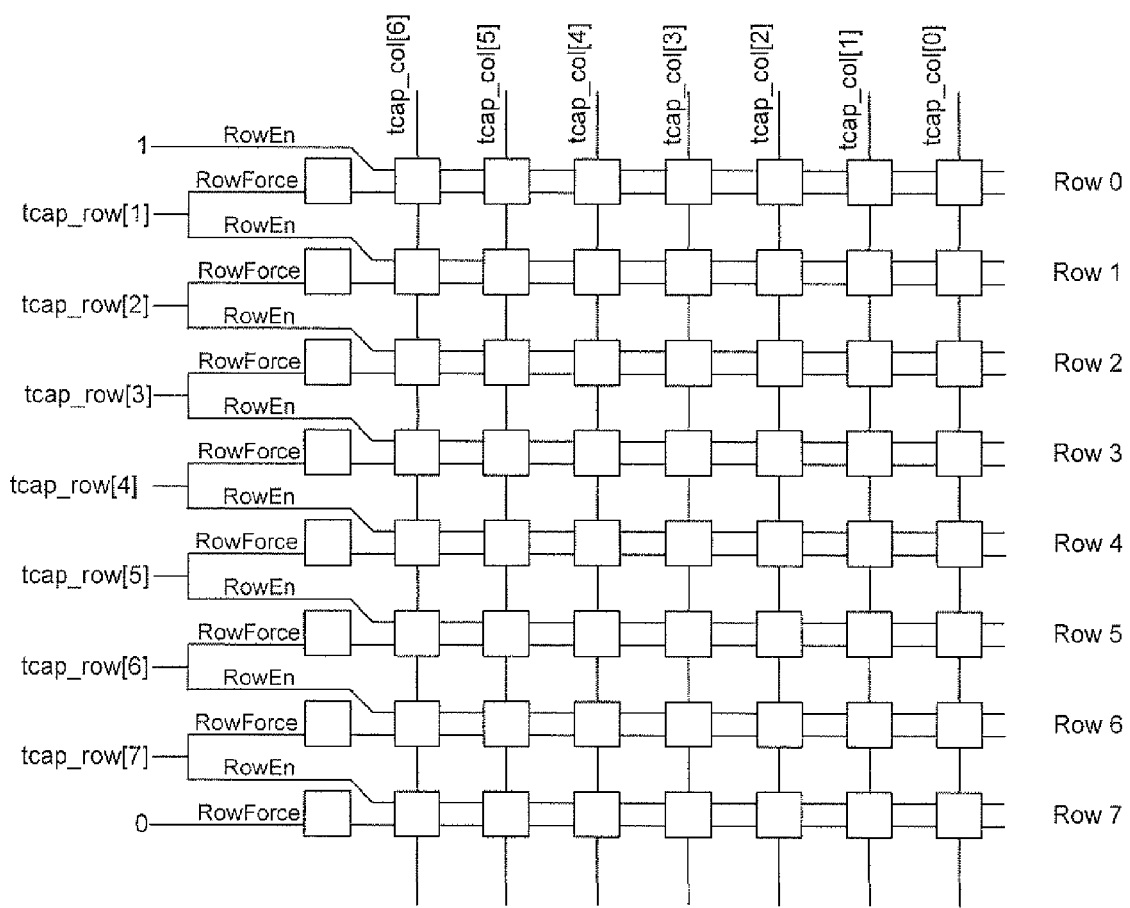
FIG. 3 illustrates a preferred embodiment of a thermometer-weighted capacitor-addressing scheme.

FIG. 3 illustrates the thermometer weight addressing system 340 for the oscillator circuit 100. It should be apparent to a person skilled in the art, that if other techniques were used to mask and unmask the load capacitors, then a different addressing methodology would be adopted. The second array of capacitors, not shown in the FIG. 3, used in the oscillator circuit is built from a cell or array with binary weighted unit capacitors 126 and a cell with thermometer weighted unit capacitors 127 that can be tiled in layout as illustrated in FIG. 3. For example, in one implementation, each thermometer weighted cell 340 has eight equal sized unit capacitors 361, 362, 363, 364, 365, 366, 367 and 368 that are arranged in rows. Each row has a RowEn and a RowForce enable input. In addition, each row has seven column address bits 351, 352, 353, 354, 355, 356 and 357. When RowEn=RowForce=0, the entire row 361 is set to minimum capacitance value. When RowEn=1 and RowForce=0, the first seven unit capacitors are turned to an ON state by the corresponding column bit 351. All eight unit capacitors in the row are turned to the ON state when RowForce=1. The addressing scheme for the thermometer weighted capacitors with eight rows 361, 362, 363, 364, 365, 366, 367 and 368 is illustrated in FIG. 3, where each square represents a unit capacitor. The first row 361 is always enabled and the last row 368 cannot be forced to the ON state. The tcap_row[7:1] bits are the thermometer decoder of xcap [9:7] bits. The tcap_col[6:0] bits are the thermometer decoder of the xcap[6:4] bits. In order to unmask each unit capacitor, which can be done one by one, at a given time the tcap_col bits need to be unmasked in an inner loop wrapped by an outer loop that unmask the tcap_row bits. In an alternative embodiment a different number of rows of capacitors may be used.

Reference is now made to FIG. 2, wherein the amplitude control loop (ACL) 234 provides the cap_ovrd logic output from the comparator that compares the amplitude of the input signal to a reference voltage. Reference is made to FIG. 1, wherein the comparator 121 has a limited amount of hysteresis to provide some immunity to amplitude transients that result from switching in the load capacitance 127.

The cap_ovrd logic signal controls the unmasking of the thermometer encoded capacitor bits in the array of capacitors 127. The row masks 124 and column masks 125 are typically shift registers that unmask the thermometer encoded capacitor bits as a function of time. Single capacitors from the array of capacitors 127 are unmasked as a function of time.

Figure 4:
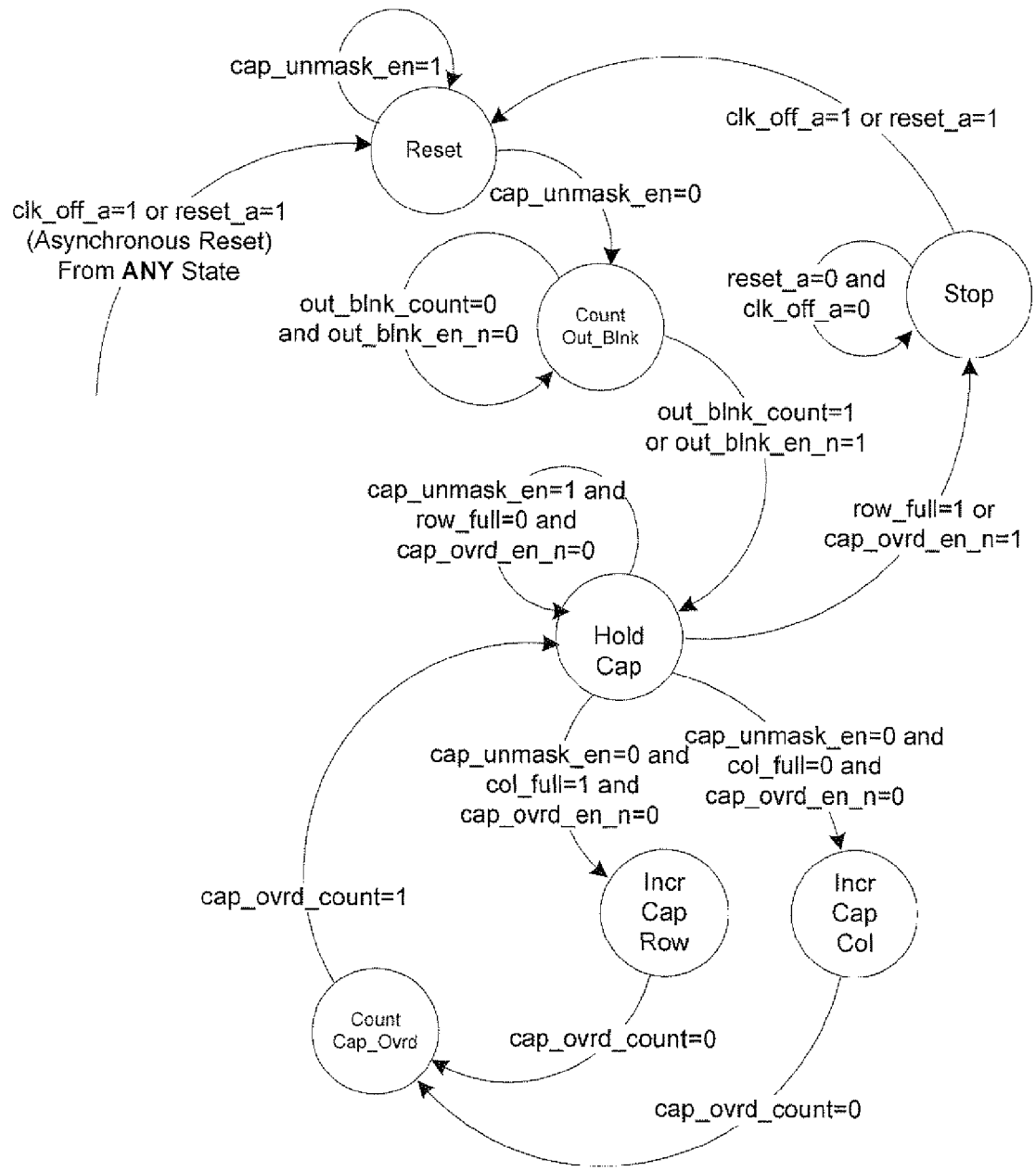
FIG. 4 illustrates a state transition diagram for the capacitor override circuit.

FIG. 4 illustrates a typical state transition diagram 402 for the oscillator circuit. The state machine 222 runs off the oscillator output clock so that it will stay in the current state if the clk_logic clock signal does not transition. This causes the signal entering the Reset state to be asynchronous for any state as shown in 410. If the watchdog 244, as shown in FIG. 2, is not used, the reset_a is the only signal that will result in the state machine entering the reset state as shown again in 410 of FIG. 4. The cntr_reset, col_reset, and row_reset signals are asserted or maintained in the Reset state. The oscillator output buffer 136 will provide unreliable clock signals after power is turned ON or the circuit comes out of power down until the 'oscillation amplitude' across the crystal is greater than a predefined value or large enough. In order to prevent the state machine 222 ending up in an unkown state, the state machine 222 will remain in the Reset state until the oscillation amplitude is large enough to result in cap_ovrd=0/ cap_unmask_en=0 as illustrated in 410 of FIG. 4. The cap_ovrd signal inside the state machine 222 is equivalent to the cap_umask_en signal shown in FIG. 1. By design, an oscillation amplitude large enough to set cap_ovrd=0/ cap_unmask_en=0, the oscillation amplitude becomes large enough to provide robust clocking to the state machine 222. Making an exit from the Reset state depends on the amplitude and allows amplitude-based output blanking along with capacitor override functionality.

In the next step 420 the state machine 222 enters the out_blnk_count state after leaving the Reset state. In the out_blnk_count state, the state machine counter 228 is enabled and counts until a transition on the out_blnk_count signal allows a transition to the Hold_Cap state as shown in 420. The count that causes the out_blnk_count signal to change is determined by the out_blnk_en_n input.

Further in this step 420, when the out_blnk_count=1, the state machine 222 will enter the Hold_Cap state. The state machine will stay in the hold state as long as the detected amplitude is small enough to result in cap_ovrd=1/cap_unmask_en=1.

In the next step 430, when the 'oscillation amplitude' increases beyond the threshold of the amplitude controller 134 and the comparator, cap_ovrd=0/cap_unmask_en=0 and the state machine 222 will transition to the incr_cap_col state if col_full=0. A one bit right shift is executed in this state to unmask one of the thermometer encoded capacitor bits. The state machine 222 will transition to the cap_ovrd_count state. The state machine 222 will remain in this state until the state machine counter 228 reaches a count which is high enough to set the cap_ovrd_count=1. Once this condition is met, the state machine 222 will go back to the Hold_Cap state of step 420.

This process is repeated until the last thermometer encoded capacitor column bit is unmasked which will set col_full=1 and cause the state machine 222 to transition to the incr_cap_row state. The incr_cap row state forces the entire row that was enabled one thermometer encoded unit capacitor at a time and resets the thermometer column mask shift register. This process is repeated until all of the row bits have been unmasked and the row_full=1 bit is set which results in a transition to the Stop state in Step 440.

The Stop state in step 420 is intended to minimize noise from the capacitor override circuit by providing a terminal state. The only exit from this state is the reset_a or clk_off_a signal that allows the state machine to enter the reset state of step 410.

The state machine 222 will not reach the Stop state of Step 420 if the amplifier gain control signal is not programmed to a large enough value or the resonator provides too high a load for the oscillator circuit. For example, some crystal manufacturers to qualify crystal oscillator chips sometimes use the series resistance qualification test. A resistor 138 is placed in series with the resonator 110 and the power is cycled. If oscillations are detected at the output, the chip is certified passed. In order to startup with the largest possible series resistor, the state machine 222 will not leave the Hold_Cap state of Step 420 after a small number of caps have been unmasked because the amplitude will not be large enough to set cap_ovrd=0/cap_unmask_en=0. This will provide the maximum amount of negative resistance in the series resistor test.

By maximizing startup negative resistance, the amplifier size and current consumption can be reduced. This provides an environment for the crystal to start can significantly reduce startup problems due to crystal drive level dependency due to large motional resistance at low drive levels.

Figure 5:
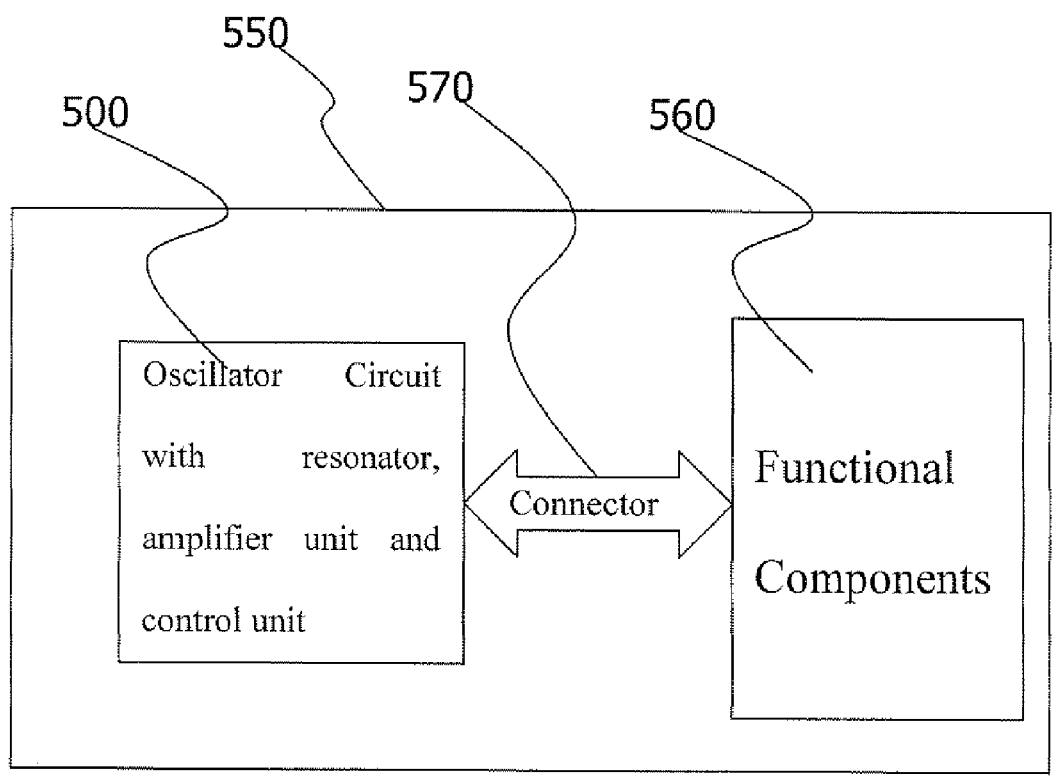
FIG. 5 illustrates a device comprising the oscillator circuit.

In a further embodiment a device 550, for example, a programmable divider of FIG. 5, comprises an oscillator circuit 500 wherein the circuit 500 further comprises a resonator, an amplifier unit and a control unit; the amplifier unit coupled to the resonator and to the control unit; and the control unit arranged to regulate a load capacitance of the resonator. The functioning and structure of the amplifier unit, the control unit and the resonator are as described above. The output clock pulse from the oscillator 500 can be input to another electronic component or functional component 560, for example a programmable divider, connected to the circuit 500. The electronic component 560 can be further connected to other electronic components in for example a mobile phone or other electronic devices. The oscillator circuit is coupled to the electronic or functional components via suitable connectors 570. The oscillator output buffer will provide unreliable clocks after the power are turned on or the device comes out of power down until the oscillation amplitude across the crystal is large enough.

Reference is now made to FIG. 1, wherein in a further embodiment, a method for generating negative resistance at startup for an oscillator circuit 100 to achieve steady state oscillations comprises in a first step generating oscillatory signals from an resonator 110 with an amplifier 132. A second step comprises compensating for a loss in the resonator 110 with an amplifier 132. A third step comprises providing an output oscillatory signal from the amplifier 132 as a feedback to the resonator 110 and a buffer amplifier 136 of the oscillator 100. A fourth step comprises providing a clock signal from a buffer amplifier 136 to a control unit 120 and simultaneously providing an output signal from a comparator 121, such as a buffer to a state machine 122 in the control unit 120, and further regulating the effective or load capacitance in the control unit 120 thereby minimizing the load capacitance at startup.

In a further embodiment the method further comprises unmasking a thermometer decoder capacitors if the detected 'oscillation amplitude' is above a threshold and controlling the time delay between each unmasking of the capacitors.

In a further embodiment the method further comprises disabling of unmasking the thermometer decoder capacitors if the detected 'oscillation amplitude' is below the threshold. The state transitions have been discussed previously with respect to FIG. 4.

In a further embodiment, a method for generating negative resistance at startup for an oscillator circuit 100 to achieve steady state oscillations comprises unmasking a thermometer decoder capacitors if the detected 'oscillation amplitude' lies in a first range other than a threshold and controlling the time delay between each unmasking of the capacitors. The method also comprises disabling of unmasking the thermometer decoder capacitors if the detected 'oscillation amplitude' lies in a second range other than the threshold.

Discussed is a circuit comprising a resonator, an amplifier unit and a control unit. The amplifier and resonator coupled to form an oscillator. The amplifier unit is coupled to the oscillator and to the control unit to regulate a load capacitance for achieving steady state oscillations during startup of an oscillator.

In a further embodiment, capacitance change mechanism is implemented using a counter circuit. The counter is initialized to the startup capacitance value and if sustained oscillations are detected, the counter adds a unit sized thermometer decoded cap until the final value of the startup capacitance is reached. If the amplitude drops below the predefined capacitor override threshold, the counter will not be allowed to change state. Two separate counters can be used, one for a row value and one for a column value.

In another embodiment, the capacitance change mechanism is implemented by an externally generated reset_a or a reset generated by a watchdog circuit. Another approach is to use the amplitude detect as a reset mechanism. Additional threshold levels could be used to allow more flexibility. For example, two thresholds could be used. The lowest threshold would be used for controlling the reset of the state machine. During the startup after receiving the reset_a signal, the state machine would not be allowed to leave the reset state until the state of the lower threshold detector indicates the minimal amplitude has been reached. The second threshold would be used to control whether the caps are unmasked or not. The advantage of this scheme is that it would allow the oscillator to provide optimal startup conditions by resetting the state machine if the amplitude is dropped below the lower threshold after reaching steady state operation. This approach would make the watchdog circuit redundant.

The present invention is not limited to binary or thermometer decoded schemes and other analog/digital decoding schemes can be used. The step sizes could be tied to the current capacitance value. For example, small steps could be used when the current load capacitance is smaller, and bigger steps could be used when the value of load capacitance increases. Moreover, the delay between step sizes could be tied to current load capacitance. The state machine could be made to implement programmable delays and step sizes for additional flexibility.

The present invention implies that the startup capacitance is near its minimum value when the state machine is in the Reset state. In yet another embodiment, optimal capacitance for startup is not the minimum capacitance and it is possible that the optimal startup capacitance is greater than the final steady state capacitance. It makes a lot of sense to generalize the invention to include these cases by making both the startup capacitance and the final capacitance programmable. In other words, the state machine will count either up or down between an initial capacitance and a final capacitance as long as cap_unmask_en-1. The programmable startup capacitance would not need to have the same precision as the final capacitance in terms of number of bits required to select the desired value.

In a further embodiment, the states of the oscillator control logic contain useful information that could be communicated to the chip level logic. For example, when the oscillator state machine reaches the Hold state, the oscillator is providing a robust output at the wrong frequency. This would be a good time to enable any Phase Locked Loops (PLLs) that use the oscillator output for their reference frequencies. The stop state indicates the output frequency is stable, which is a good time to enable any chip inputs.

In another embodiment, a circuit 600, comprises means for generating oscillations 610, means for amplification 620 and means for controlling 630. The means for amplification is coupled to the means for generating oscillations and to the means for controlling, and the means for controlling is arranged to regulate a load capacitance of the means for generating oscillations. The means for generating oscillations comprises a resonator circuit and an amplifier circuit. The means for amplification comprises an amplifier, an amplitude controller and a buffer amplifier, the amplifier is coupled to the amplitude controller, the buffer amplifier, the oscillator and the amplifier compensate for losses in an input oscillatory signal generated by the resonator and feeds back an output oscillatory signal to the resonator. An amplitude controller of the means for amplification is configurable to detect steady state resonator amplitudes and is configurable to provide a gain control signal to the amplifier regulating the amplitudes of the means for amplification. A state machine of the means for controlling regulates the load capacitance to a minimum value at startup.

It is understood that while the embodiments set forth herein have been described in detail, it should be understood that the present invention could be subject to various changes, substitutions, and alterations without departing from the spirit and scope of the invention. For purposes of clarity, many of the details of the improved semiconductor device and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method for generating a negative resistance on startup of an oscillator, the method comprising:

generating an input oscillatory signal from a resonator;

compensating for a loss in the input oscillatory signal with an amplifier;

providing an amplifier output to the resonator and a buffer amplifier; and outputting a clock signal from the buffer amplifier to a state machine of a control unit and substantially simultaneously outputting a regulating signal from a comparator to the state machine of the control unit; wherein the state machine regulates load capacitance to a value below a capacitance threshold at startup by;

detecting oscillation amplitude of the input oscillatory signal;

unmasking one or more decoder capacitors from an array of detector capacitors when the detected oscillation amplitude is above an amplitude threshold;

controlling a time delay between unmasking individual decoder capacitors; and disabling said unmasking the individual decoder capacitors when the detected oscillation amplitude is below the amplitude threshold.

2. The method of claim 1, wherein the step of substantially simultaneously outputting comprises regulating load capacitance in the control unit during steady state oscillations.

3. The method of claim 1, wherein the array of detector capacitors comprises thermometer decoder capacitors.

4. The method of claim 1, wherein the buffer amplifier is arranged to convert the input oscillatory signal generated by the resonator into a digital signal and the clock signal provided to the control unit.

* * * * *